(12) United States Patent
Zhang

(10) Patent No.: US 9,728,749 B2
(45) Date of Patent: Aug. 8, 2017

(54) OLED ARRAY SUBSTRATE, MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/761,962

(22) PCT Filed: Apr. 17, 2015

(86) PCT No.: PCT/CN2015/076848
§ 371 (c)(1),
(2) Date: Jul. 20, 2015

(87) PCT Pub. No.: WO2016/065864
PCT Pub. Date: May 6, 2016

(65) Prior Publication Data
US 2016/0254494 A1    Sep. 1, 2016

(30) Foreign Application Priority Data
Oct. 31, 2014    (CN) .......................... 2014 1 0602692

(51) Int. Cl.
*H01L 51/00* (2006.01)
*H01L 51/56* (2006.01)
*H01L 51/52* (2006.01)

(52) U.S. Cl.
CPC ........ *H01L 51/5265* (2013.01); *H01L 51/001* (2013.01); *H01L 51/0011* (2013.01);
(Continued)

(58) Field of Classification Search
CPC ................. H01L 51/5275; H01L 51/52; H01L 51/5262; H01L 51/56; H01L 2251/301;
(Continued)

(56) References Cited

U.S. PATENT DOCUMENTS

2003/0067688 A1* 4/2003 Wang .................. G02B 3/0012
359/652
2003/0155593 A1    8/2003 Kang et al.
(Continued)

FOREIGN PATENT DOCUMENTS

CN        103370984 A     10/2013
CN        103715372 A     4/2014
(Continued)

OTHER PUBLICATIONS

Chinese Office Action dated Mar. 21, 2016 issued in corresponding Chinese Application No. 201410602692.7.
(Continued)

*Primary Examiner* — Caridad Everhart
(74) *Attorney, Agent, or Firm* — Nath, Goldberg & Meyer; Joshua B. Goldberg; Annie J. Kock

(57) ABSTRACT

The present invention provides an OLED array substrate, a manufacturing method thereof, an OLED display panel and an OLED display device. The OLED array substrate comprises a substrate and a plurality of pixel units provided thereon, each pixel unit comprising a TFT, and a first electrode, an organic light-emitting layer, a second electrode and an optical coupling layer sequentially arranged on the TFT, wherein the optical coupling layer comprises a bottom contacting with the second electrode and an arched top protruding towards a light-exiting direction. By forming the optical coupling layer of each pixel unit on the OLED array substrate to be the arched top optical coupling layer, the OLED array substrate, the manufacturing method thereof,
(Continued)

the OLED display panel and the OLED display device of the present invention attenuates total reflection of light inside the optical coupling layer, thereby improving light extraction efficiency.

15 Claims, 6 Drawing Sheets

(52) U.S. Cl.
 CPC ...... H01L 51/5262 (2013.01); H01L 51/5281 (2013.01); H01L 51/56 (2013.01); *H01L 2227/323* (2013.01)

(58) Field of Classification Search
 CPC ........... H01L 2251/303; H01L 51/0011; H01L 51/5281; H01L 51/5265; H01L 2227/323
 See application file for complete search history.

(56) References Cited

U.S. PATENT DOCUMENTS

| | | | | |
|---|---|---|---|---|
| 2007/0222368 | A1* | 9/2007 | Lee | H01L 27/3206 313/503 |
| 2009/0267494 | A1* | 10/2009 | Lee | H01L 51/5265 313/504 |
| 2011/0220936 | A1* | 9/2011 | Fujimoto | H01L 33/38 257/98 |
| 2015/0137101 | A1* | 5/2015 | Choi | H01L 51/5209 257/40 |
| 2015/0194474 | A1* | 7/2015 | Choi | H01L 27/3232 349/69 |
| 2016/0291377 | A1* | 10/2016 | Kosuge | G02F 1/13439 |

FOREIGN PATENT DOCUMENTS

| | | | | |
|---|---|---|---|---|
| CN | 203690349 U | 7/2014 | | |
| CN | 104319351 A | 1/2015 | | |
| EP | 2 172 990 A1 | 4/2010 | | |
| JP | 2005-079014 A | * | 3/2005 | ............ H05B 33/24 |
| JP | 2010-40427 A | 2/2010 | | |

OTHER PUBLICATIONS

International Search Report dated May 27, 2015 issued in International Application No. PCT/CN2015/076848 along with the English translation of the Written Opinion of the International Searching Authority.

* cited by examiner

OLED ARRAY SUBSTRATE, MANUFACTURING METHOD THEREOF, DISPLAY PANEL AND DISPLAY DEVICE

This is a National Phase Application filed under 35 U.S.C. 371 as a national stage of PCT/CN2015/076848 filed on Apr. 17, 2015, an application claiming the benefit to Chinese application No. 201410602692.7 filed on Oct. 31, 2014; the content of each of which is hereby incorporated by reference in its entirety.

FIELD OF THE INVENTION

The present invention relates to the field of display technology, and particularly relates to an OLED array substrate, a manufacturing method thereof, an OLED display panel and an OLED display device.

BACKGROUND OF THE INVENTION

Organic Light Emitting Diodes (OLEDs) are considered to have wide application prospect in flat-panel display products due to their advantages such as self-emission, all-solid state, wide visual angle, quick response and the like. OLED displays have been regarded as the new generation of flat-panel displays since liquid crystal displays and plasma displays. Currently, OLEDs have been widely applied in the fields of both display and illumination. To ensure relatively high functional reliability and relatively low power consumption of a semiconductor light-emitting device in an OLED, external quantum efficiency of the semiconductor light-emitting device itself needs to be maximized.

In general, the external quantum efficiency of a semiconductor light-emitting device depends on internal quantum efficiency and light extraction efficiency (LEE) thereof. Since the internal quantum efficiency is decided by the characteristics of the material itself, it is particularly important to improve the light extraction efficiency under the condition that the internal quantum efficiency cannot be improved effectively. Improving the light extraction efficiency is to introduce as much light emitted from inside the OLED as possible to the outside of the semiconductor light-emitting device.

As shown in FIG. 1, an existing OLED array substrate includes a substrate 1 on which thin film transistors (not shown) are provided, and OLED units controlled by the thin film transistors on the substrate 1, and a typical OLED unit comprises an anode 2, an organic light-emitting layer 3 and a cathode 3 which are sequentially arranged. For a top-emitting OLED array substrate, as the cathode 4 is generally a semi-transparent metal electrode, reflection of light emitted by the organic light-emitting layer 3 at this electrode may increase, which leads to interference among multiple photon beams, and results in obvious microcavity effect (a phenomenon of different intensity and wavelength of light at different emission angle due to optical interference inside the device). Therefore, when a display comprising such top-emitting OLED array substrate is used, density and color of emitted light may change with the visual angle.

In the prior art, in order to attenuate the microcavity effect, an optical coupling layer 5 may be coated on the cathode 4, and material for forming the optical coupling layer 5 has a refractive index larger than that of material for forming the cathode 4, in other words, the refractive index of the optical coupling layer 5 is larger than that of the cathode 4. Experiments showed that when the refractive index of the optical coupling layer 5 (the refractive index of the optical coupling layer 5 is generally larger than 2.0) is larger than those of the organic light-emitting layer 3 and the cathode 4, transmittance of the cathode 4 increases, and increase in the transmittance of the cathode 4 will attenuate the microcavity effect.

In the prior art, a open type mask is usually applied to form the optical coupling layer 5 by evaporation, that is, evaporation are performed on all OLED units at the same time to form an uniform-thickness type optical coupling layer 5 as shown in FIG. 1. However, as the refractive index of the optical coupling layer 5 is relatively high, and is usually larger than that of a gas blanket outside the optical coupling layer 5, for example, is larger than that of a nitrogen blanket, which results in total reflection inside the uniform-thickness type optical coupling layer 5, thus a part of light intensity is lost and the light extraction efficiency is lowered.

SUMMARY OF THE INVENTION

An object of the present invention is to provide an OLED array substrate and a manufacturing method thereof, so as to solve the problem of lowered light extraction efficiency caused by total reflection of light occurring inside the uniform-thickness type optical coupling layer of an OLED array substrate.

According to an aspect of the present invention, there is provided an OLED array substrate, which comprises a substrate and a plurality of pixel units provided on the substrate, each pixel unit comprising a thin film transistor, and a first electrode, an organic light-emitting layer, a second electrode and an optical coupling layer that are sequentially arranged on the thin film transistor, wherein, the optical coupling layer comprises a bottom contacting with the second electrode and an arched top protruding towards a light-exiting direction.

Preferably, the optical coupling layer has a thickness of $\lambda/4n$, wherein, $\lambda$ is wavelength of light emitted by the organic light-emitting layer, and n is refractive index of the optical coupling layer.

Preferably, the first electrode serves as an anode, and the second electrode serves as a cathode.

Preferably, parts of the optical coupling layers corresponding to the pixel units having different colors have different thicknesses.

According to another aspect of the present invention, there is further provided a manufacturing method of an OLED array substrate, and the manufacturing method comprises a step of:

forming, by way of evaporation, an arched top optical coupling layer on a substrate on which a first electrode, an organic light-emitting layer and a second electrode are formed, by using a mask.

Preferably, the mask has a thickness in the range of 100 nm to 200 nm.

Preferably, the mask has a plurality of openings corresponding to a plurality of pixel units, wherein each opening is configured to allow evaporating material to pass therethrough to form the arched top optical coupling layer on the corresponding pixel unit; and length and width of each opening are 20-50 nm larger than those of the corresponding pixel unit, respectively.

Preferably, the arched top optical coupling layer have a thickness of $\lambda/4n$, wherein, $\lambda$ is wavelength of light emitted by the organic light-emitting layer, and n is refractive index of the arched top optical coupling layer.

Preferably, the same mask is used for manufacturing the arched top optical coupling layers corresponding to the pixel units having different colors.

Preferably, a mask corresponding to the pixel units having a color is used for manufacturing the arched top optical coupling layers corresponding to the pixel units having the color.

According to still another aspect of the present invention, there is provided an OLED display panel, which comprises any one of the above OLED array substrate.

According to another aspect of the present invention, there is provided an OLED display device, which comprises the above OLED display panel.

In the OLED array substrate, the manufacturing method thereof, the OLED display panel and the OLED display device of the present invention, by forming the optical coupling layer to be the arched top optical coupling layer, the total reflection of light inside the optical coupling layer is attenuated, thereby improving the light extraction efficiency.

DETAILED DESCRIPTION OF THE EMBODIMENTS

To make a person skilled in the art better understand the technical solution of the present invention, the present invention is further described in detail below in conjunction with the accompanying drawings and the specific implementations.

First Embodiment

Figure 1:
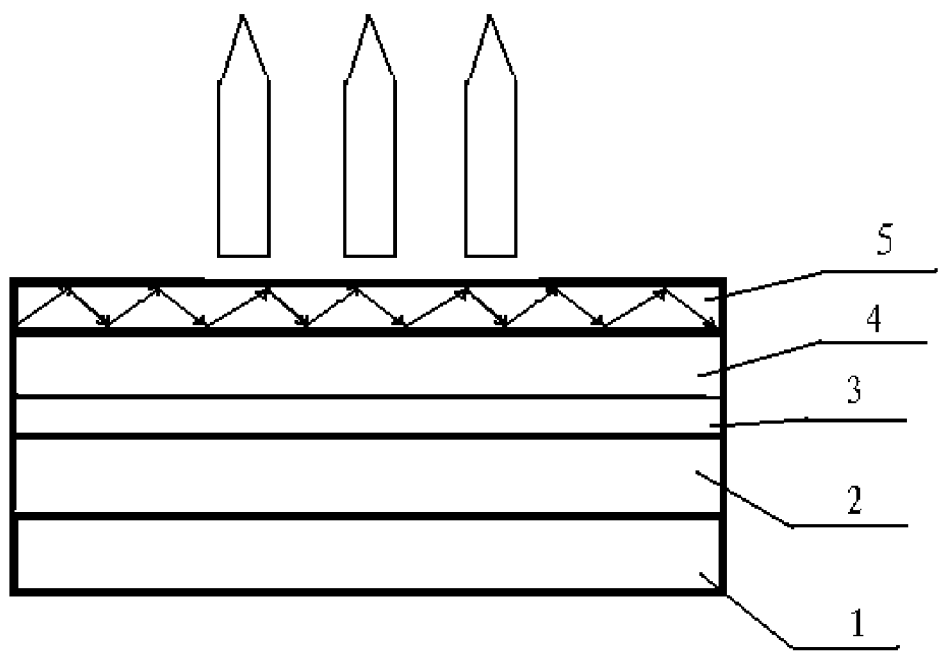
FIG. 1 is a schematic diagram of a structure of an OLED array substrate in the prior art.
Figure 2:
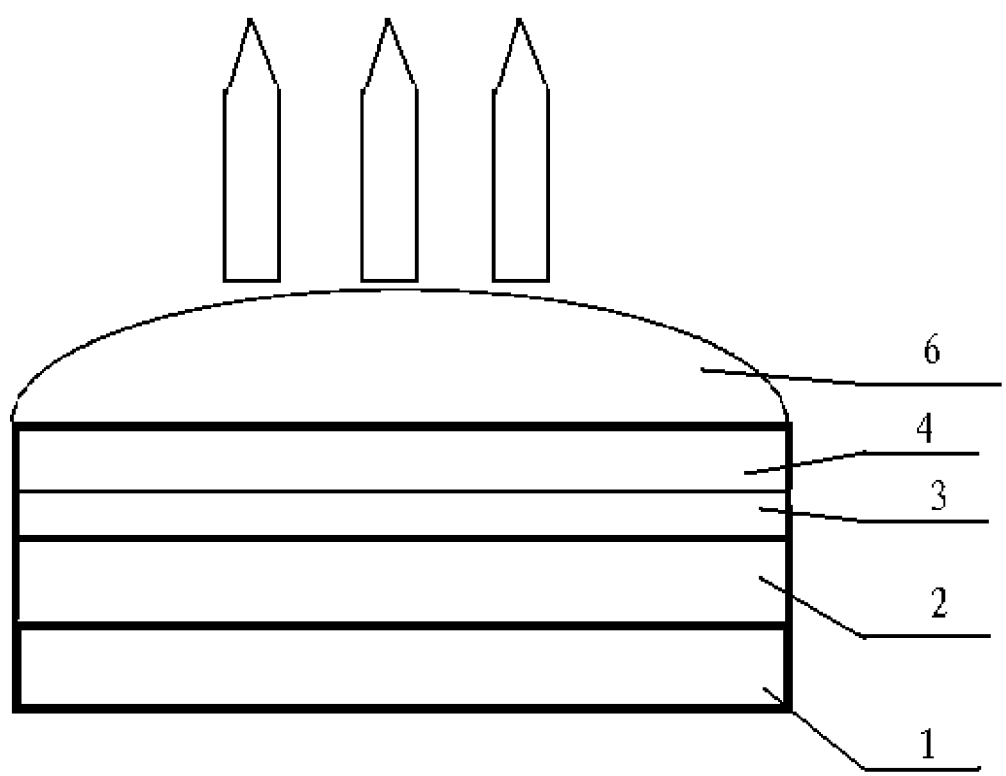
FIG. 2 is a schematic diagram of a structure of an OLED array substrate in a first embodiment of the present invention.

As shown in FIG. 2, this embodiment provides an OLED array substrate, which comprises a substrate 1 and a plurality of pixel units provided on the substrate 1, each pixel unit comprises a thin film transistor (not shown), and a first electrode 2, an organic light-emitting layer 3, a second electrode 4 and an optical coupling layer 6 that are sequentially arranged on the thin film transistor, and the optical coupling layer 6 comprises a bottom contacting with the second electrode 4 and an arched top protruding towards a light-exiting direction (the direction indicated by the arrows in FIG. 2). In the context, for ease of description, the optical coupling layer 6 having the arched top provided by the present invention is referred to as arched top optical coupling layer 6.

Those skilled in the art should understand that, the thin film transistor is configured to control the organic light-emitting layer 3 to emit light. The first electrode 2 and the second electrode 4 are configured to provide holes and electrons to the organic light-emitting layer 3 to enable the organic light-emitting layer 3 to emit light. The refractive index of the arched top optical coupling layer 6 is larger than that of the second electrode 4, and is configured to improve the light transmittance of the second electrode 4.

Figure 3:
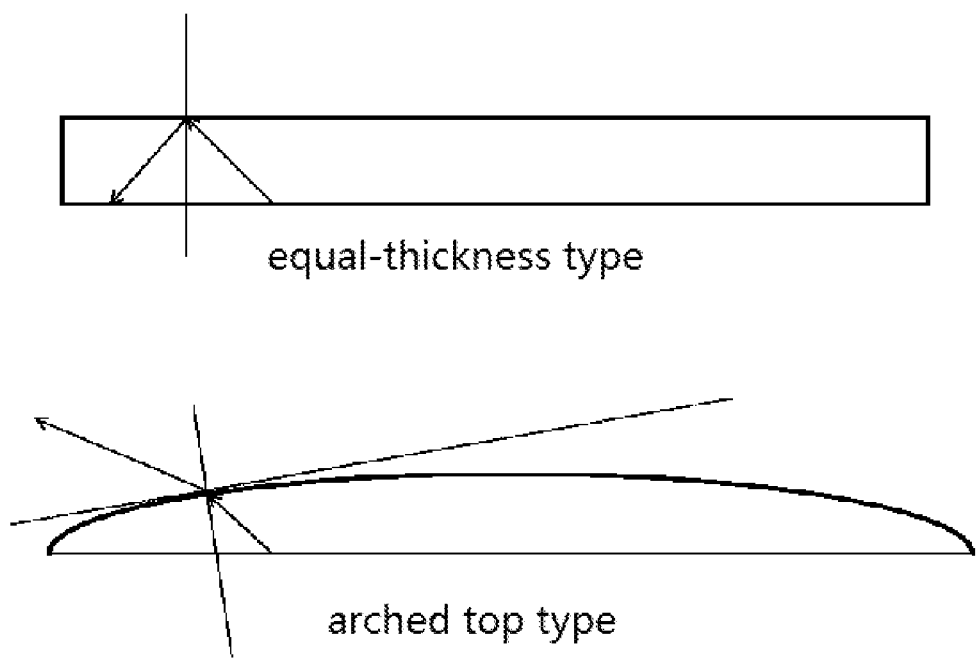
FIG. 3 is a schematic diagram showing a comparison of light paths in an arched top optical coupling layer in the first embodiment and an uniform-thickness type optical coupling layer in the prior art.

Compared to the uniform-thickness type optical coupling layer in the prior art, the arched top optical coupling layer 6 provided by this embodiment can attenuate the total reflection inside the optical coupling layer. As shown in FIG. 3, when light enters at the same angle, for the uniform-thickness type optical coupling layer, as the incident angle is larger than the critical angle, total reflection occurs at the interface of the uniform-thickness type optical coupling layer; but for the arched top optical coupling layer, the incident angle decreases due to the arched interface, when the incident angle is smaller than the critical angle, refraction occurs at the interface of the arched top optical coupling layer, and light is emitted out of the arched top optical coupling layer, thereby facilitating extraction of light.

Compared to the uniform-thickness type optical coupling layer in the prior art, the optical coupling layer in the OLED array substrate of the present invention is configured to have an arched top, thus can attenuate the total reflection of light inside the optical coupling layer, thereby improving light extraction efficiency.

Preferably, the arched top optical coupling layer 6 has a thickness of $\lambda/4n$, wherein, $\lambda$ is the wavelength of light emitted by the organic light-emitting layer 3, and n is the refractive index of the arched top optical coupling layer 6. The arched top optical coupling layer 6 with such thickness has the largest light transmittance (minimum total reflection). It should be noted that, in the present invention, the thickness of the arched top optical coupling layer 6 being $\lambda/4n$ means that the maximum thickness of the arched top optical coupling layer 6 is $\lambda/4n$.

In order to further optimize performance of the OLED array substrate (i.e., further increase light transmittance and reduce total reflection of light), parts of the arched top optical coupling layers 6 corresponding to the pixel units having different colors have different thicknesses. For example, in a case where pixel units are classified into red pixel units, green pixel units and green pixel units, a part of the arched top optical coupling layers 6 corresponding to the red pixel units have a first thickness, a part of the arched top optical coupling layers 6 corresponding to the green pixel units have a second thickness, and a part of the arched top optical coupling layers 6 corresponding to the green pixel units have a third thickness, wherein the first thickness, the second thickness and the third thickness are different from each other. It should be noted that, it is only described by taking the case where pixel units are classified into red pixel units, green pixel units and green pixel units as an example, but the present invention is not limited thereto. It helps to improve optical performance of the device when parts of the arched top optical coupling layers 6 corresponding to the pixel units having different colors have different thicknesses.

In the present embodiment, the first electrode 2 serves as an anode, and the second electrode 4 serves as a cathode. That is, the above OLED array substrate is a top-emitting OLED array substrate.

Second Embodiment

Figure 4:
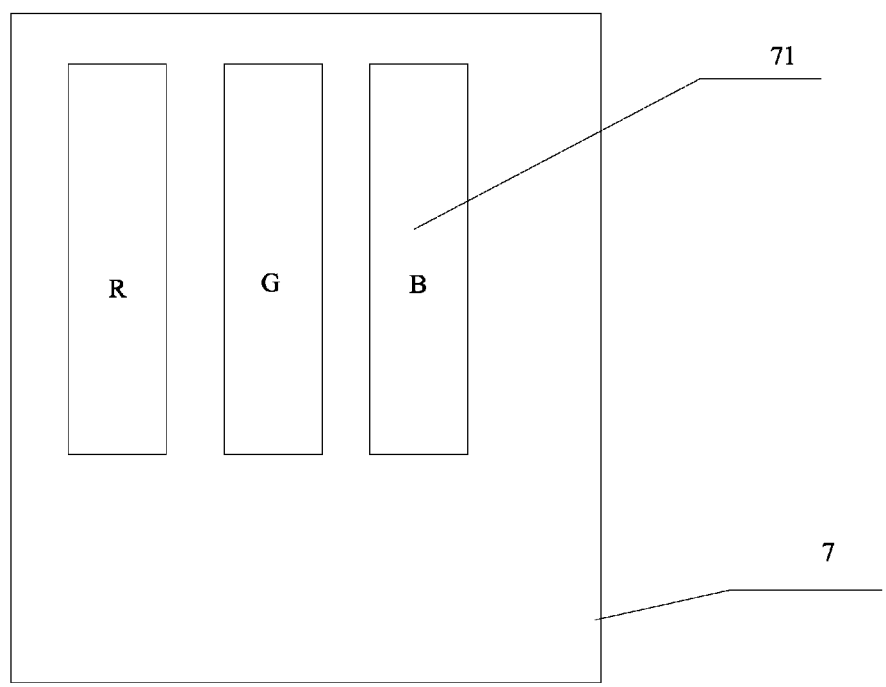
FIG. 4 is a schematic top view of a mask used for manufacturing an arched top optical coupling layer in a second embodiment of the present invention.
Figure 5:
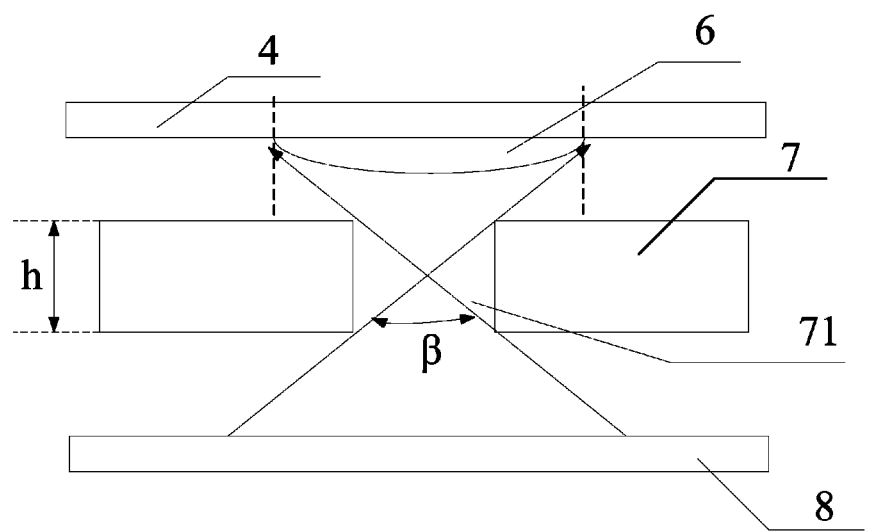
FIG. 5 is a cross-sectional view of a mask being used in evaporation in the second embodiment of the present invention.
Figure 6:
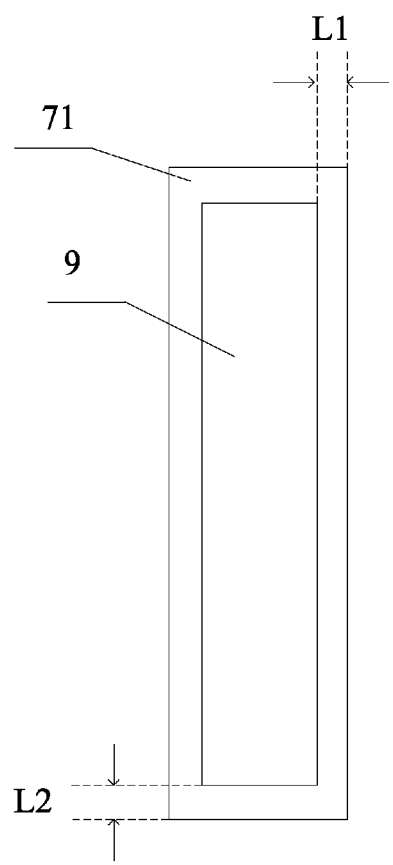
FIG. 6 is a diagram showing a comparison of sizes of an opening 71 of the mask in the second embodiment of the present invention and the corresponding pixel unit thereof.

As shown in FIGS. 4 to 6, this embodiment provides a manufacturing method of an OLED array substrate, and the method includes, after sequentially forming a thin film transistor, a first electrode 2, an organic light-emitting layer 3 and a second electrode 4 on a substrate, a step of: forming, by way of evaporation, an arched top optical coupling layer 6 on the substrate 1 with the second electrode 4 formed thereon, by using a mask 7.

A method for forming the thin film transistor, the first electrode 2, the organic light-emitting layer 3 and the second electrode 4 on the substrate may refer to the prior art, which is not limited in the present invention. In addition, evaporating a material for forming the arched top optical coupling layer 6 also belong to the prior art, and is not repeated herein.

A top view of partial structure of the mask 7 used in evaporation is shown in FIG. 4, the mask 7 includes a plurality of openings 71 corresponding to a plurality of pixel units, each opening 71 corresponds to one pixel unit, and the opening 71 is configured to allow evaporating material to pass therethrough to form the arched top optical coupling layer 6 on the corresponding pixel unit.

The openings 71 of the mask 7 are arranged to correspond to the pixel units, such that evaporating material 8 is evaporated onto the corresponding pixel units through the openings 71, so as to form the arched top optical coupling layers 6. For clarity, the mask 7 shown in FIG. 4 only illustrates three openings 71 respectively corresponding to three pixel units, namely, R, G and B pixel units, without illustrating other openings.

The cross-sectional view of the mask 7 being used is shown in FIG. 5, the evaporating material 8 on an evaporating plate is evaporated, through the opening 71, onto a portion of the cathode 4 corresponding to the pixel unit. Part of the evaporating material 8 beyond the angle of β will not be evaporated onto the cathode 4, material evaporated onto the middle portion of the pixel unit has a larger thickness, while material evaporated onto the marginal portion of the pixel unit has a smaller thickness (due to the shielding effect of the mask), and therefore, the arched top optical coupling layer 6 which is thick in the middle and thin at the edge can be easily formed. Here, h stands for the thickness of the mask 7, the thicker the mask 7 is, the more obvious the shielding effect is, and the easier it is to form the arched top optical coupling layer 6 which is thick in the middle and thin at the edge. Preferably, the thickness h of the mask 7 is in the range of 100 nm to 200 nm, and the arched top optical coupling layers 6 can be formed by appropriately controlling the thickness h of the mask 7.

As shown in FIG. 6, the inner rectangle in FIG. 6 corresponds to the size of the pixel unit 9, and the outer rectangle corresponds to the size of the opening 71 of the mask 7. Specifically, the length of the opening 71 of the mask 7 (in the vertical direction in FIG. 6) is 5-20 μm (twice the length of L2 in FIG. 6) larger than that of the corresponding pixel unit 9, wherein L2 is the length by which one end of the opening 71 exceeds that of the pixel unit 9 in the length direction (in the vertical direction in FIG. 6). The width of the opening 71 of the mask 7 (in the horizontal direction in FIG. 6) is 5-20 μm (twice the width of L1 in FIG. 6) larger than that of the corresponding pixel unit 9, wherein L1 is the width by which one end of the opening 71 exceeds that of the pixel unit 9 in the width direction (in the horizontal direction in FIG. 6).

As such, the opening 71 of the mask 7 can cover the corresponding pixel unit 9, as the mask 7 has the shielding effect, the opening 71 of the mask 7 having a size larger than that of the corresponding pixel unit 9 can even ensure that the arched top optical coupling layers 6 which is thick in the middle and thin at the edge is formed on the pixel unit 9. It should be understood that, the above relation of sizes between the opening 71 of the mask 7 and the corresponding pixel unit 9 is applicable to the manufacture of most products, but for special products or process conditions, the relation of sizes therebetween may be adjusted adaptively.

It should be understood that, there are many parameters that can affect the thickness of the arched top optical coupling layers 6 during evaporating, such as evaporating time, evaporating rate, distances of the surface to be evaporated (the cathode 4) from the mask 7 and the evaporating material 8, respectively, and the like, and the arched top optical coupling layers 6 may be formed to have a predetermined thickness by adjusting the foregoing parameters, which is not repeated herein.

The optimum thickness of the arched top optical coupling layer 6 is $\lambda/4n$, wherein, $\lambda$ is the wavelength of light emitted by the organic light-emitting layer 3, and n is the refractive index of the arched top optical coupling layer 6. In this case, the arched top optical coupling layer 6 has the largest light transmittance and the minimum total reflection of light.

In order to achieve the optimum thickness of the optical coupling layer 6 for the pixel units having different colors, for the pixel units having a color, a mask 7 corresponding to the pixel units having said color may be used to perform evaporation for forming the arched top optical coupling layer 6.

Of course, it can be understood that, in order to decrease difficult of massive production, the same mask 7 may be used in manufacturing the arched top optical coupling layers 6 corresponding to the pixel units having different colors. In this case, evaporation for forming the arched top optical coupling layer 6 corresponding to the pixel units having different colors can be achieved by moving the mask 7.

Third Embodiment

This embodiment provides an OLED display panel, which comprises the above OLED array substrate. The OLED display panel provided by this embodiment may also include other known structures such as color filter and the like, which are not elaborated in the present invention.

Fourth Embodiment

This embodiment provides an OLED display device, which comprises the above OLED display panel. The OLED display device provided by this embodiment may also include other known structures such as power supply unit and the like, which are not elaborated in the present invention.

It should be understood that the above implementations are only exemplary implementations for illustrating the principle of the present invention; however, the present invention is not limited thereto. Various variations and improvements can be made by a person skill in the art without departing from the spirit and essence of the present invention, and these variations and improvements should also be considered to be within the protection scope of the present invention.

The invention claimed is:

1. An OLED array substrate, comprising a substrate and a plurality of pixel units provided on the substrate, each pixel unit comprising a thin film transistor, and a first electrode, an organic light-emitting layer, a second electrode and an optical coupling layer that are sequentially arranged on the thin film transistor, wherein, the optical coupling layer comprises a bottom contacting with the second electrode and an arched top protruding towards a light-exiting direction, and parts of the optical coupling layers corresponding to the pixel units having different colors have different thicknesses.

2. The OLED array substrate according to claim 1, wherein the optical coupling layer has a thickness of $\lambda/4n$, wherein, $\lambda$ is wavelength of light emitted by the organic light-emitting layer, and n is refractive index of the optical coupling layer.

3. The OLED array substrate according to claim 1, wherein the first electrode serves as an anode, and the second electrode serves as a cathode.

4. The OLED array substrate according to claim 1, wherein refractive index of the optical coupling layer is larger than that of the second electrode.

5. A manufacturing method of an OLED array substrate, comprising a step of:

forming, by way of evaporation, an arched top optical coupling layer on a substrate on which a first electrode, an organic light-emitting layer and a second electrode are formed, by using a mask, wherein parts of the optical coupling layer corresponding to pixel units having different colors have different thicknesses, and the arched top optical coupling layer is directly formed on the second electrode.

6. The manufacturing method of an OLED array substrate according to claim 5, wherein the mask has a thickness in the range of 100 nm to 200 nm.

7. The manufacturing method of an OLED array substrate according to claim 5, wherein the mask has a plurality of openings corresponding to a plurality of pixel units, wherein each opening is configured to allow evaporating material to pass therethrough to form the arched top optical coupling layer on the corresponding pixel unit; and length and width of each opening are 20-50 nm larger than those of the corresponding pixel unit, respectively.

8. The manufacturing method of an OLED array substrate according to claim 5, wherein the arched top optical coupling layer have a thickness of $\lambda/4n$, wherein, $\lambda$ is wavelength of light emitted by an organic light-emitting layer, and n is refractive index of the arched top optical coupling layer.

9. The manufacturing method of an OLED array substrate according to claim 5, wherein the same mask is used for manufacturing the arched top optical coupling layers corresponding to the pixel units having different colors.

10. The manufacturing method of an OLED array substrate according to claim 5, wherein a mask corresponding to the pixel units having a color is used for manufacturing the arched top optical coupling layers corresponding to the pixel units having the color.

11. The manufacturing method of an OLED array substrate according to claim 5, wherein material for forming the optical coupling layer has a larger refractive index larger than the second electrode.

12. An OLED display device, comprising an OLED display panel, which comprises an OLED array substrate, wherein the OLED array substrate comprises a substrate and a plurality of pixel units provided on the substrate, each pixel unit comprising a thin film transistor, and a first electrode, an organic light-emitting layer, a second electrode and an optical coupling layer that are sequentially arranged on the thin film transistor, wherein, the optical coupling layer comprises a bottom contacting with the second electrode and an arched top protruding towards a light-exiting direction; and parts of the optical coupling layers corresponding to the pixel units having different colors have different thicknesses.

13. The OLED display device according to claim 12, wherein the optical coupling layer has a thickness of $\lambda/4n$, wherein, $\lambda$ is wavelength of light emitted by the organic light-emitting layer, and n is refractive index of the optical coupling layer.

14. The OLED display device according to claim 12, wherein the first electrode serves as an anode, and the second electrode serves as a cathode.

15. The OLED display device according to claim 12, wherein refractive index of the optical coupling layer is larger than that of the second electrode.

* * * * *